United States Patent [19]
Sakata et al.

[11] Patent Number: 4,602,866
[45] Date of Patent: Jul. 29, 1986

[54] EXPOSURE DEVICE FOR PLATEMAKING APPARATUS

[75] Inventors: Minehiro Sakata; Tamio Iwamoto, both of Hachiouji; Takeo Kadoi, Nishitama; Seiichi Honma, Hino; Yousuke Igarashi, Tachikawa, all of Japan

[73] Assignee: Iwatsu Electric Co., Ltd., Tokyo, Japan

[21] Appl. No.: 732,473

[22] Filed: May 9, 1985

[30] Foreign Application Priority Data

Jun. 19, 1984 [JP] Japan ................................. 59-124406
Jun. 21, 1984 [JP] Japan ................................. 59-126395

[51] Int. Cl.⁴ ...................... G03B 27/52; G03B 27/70
[52] U.S. Cl. ...................................... 355/43; 355/51; 355/45; 355/74
[58] Field of Search ..................... 355/53, 54, 71, 74, 355/45, 51, 43

[56] References Cited

U.S. PATENT DOCUMENTS 3,689,149 9/1972 Livingood ...................... 355/54 X Primary Examiner—Richard A. Wintercorn
Attorney, Agent, or Firm—Townsend & Townsend

[57] ABSTRACT

An exposure device for a platemaking apparatus has: a plate material feed unit consisting of a suction mechanism for feeding and stopping a plate material on an exposure unit, conveyor belts, drive motors and the like; two shielding curtains respectively rolled at two ends of the exposure unit and selectively extended on the exposure unit; shielding curtain drive units for independently driving the two shielding curtains; a setting unit for setting exposure conditions of a document image to be formed on the plate material; and a control unit for controlling the motors of the plate material feed unit and the shielding curtain drive units in a given relationship in response to the conditions set in the setting means, wherein an identical document image is formed on different positions of a single plate material a plurality of times.

3 Claims, 24 Drawing Figures

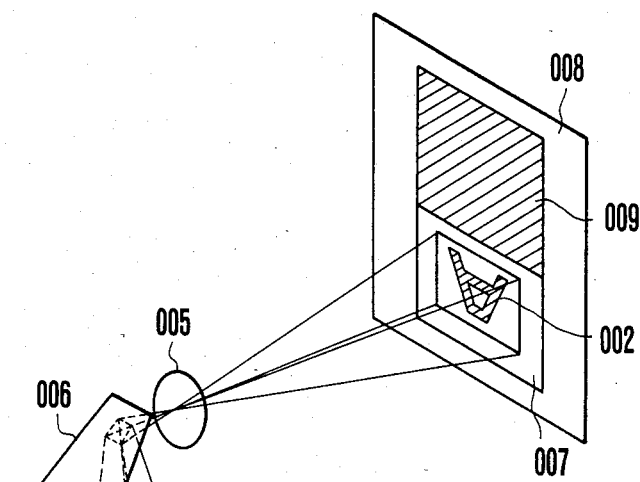
FIG. 1A
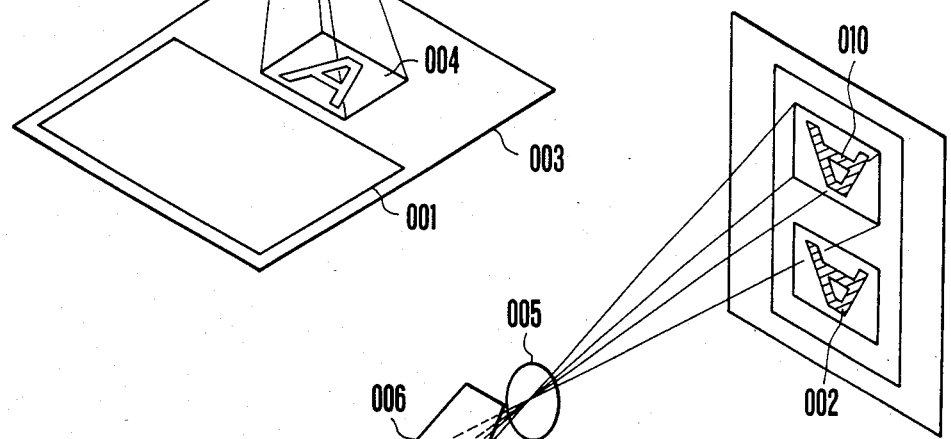
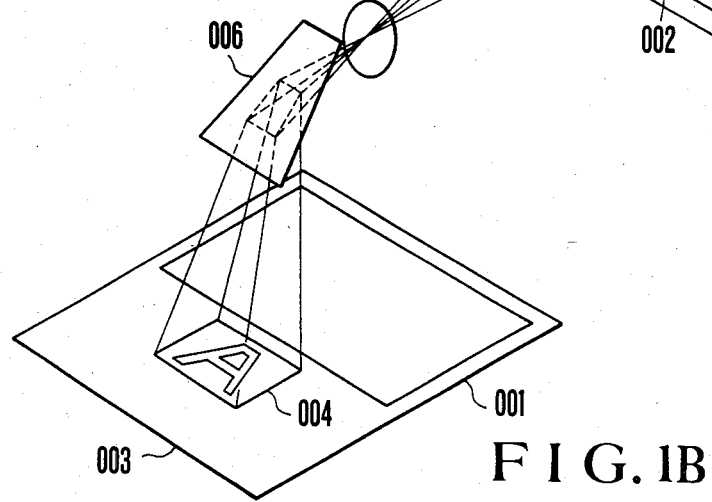
FIG. 1B

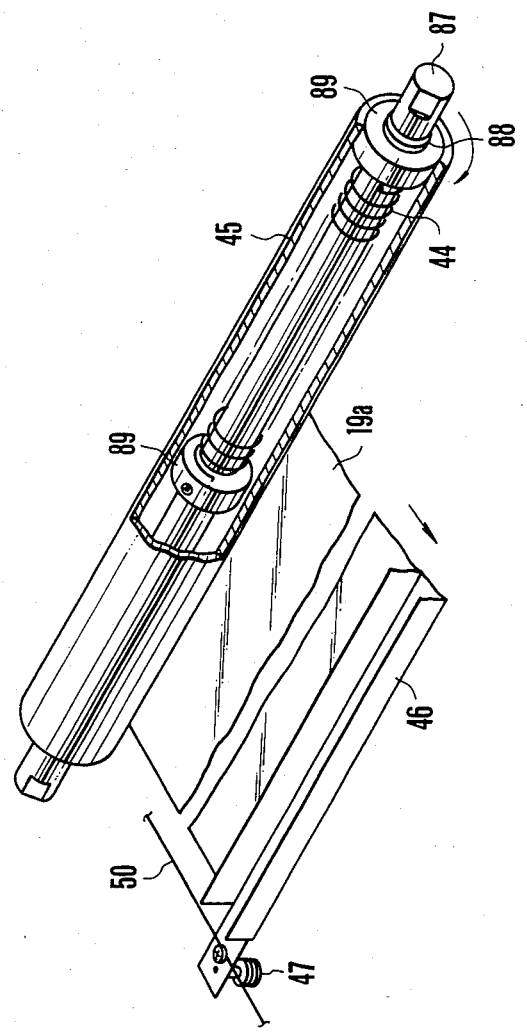

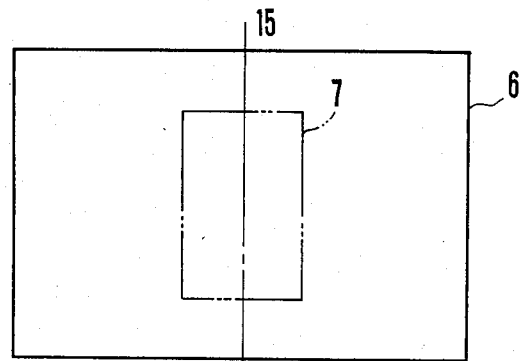
FIG.8A
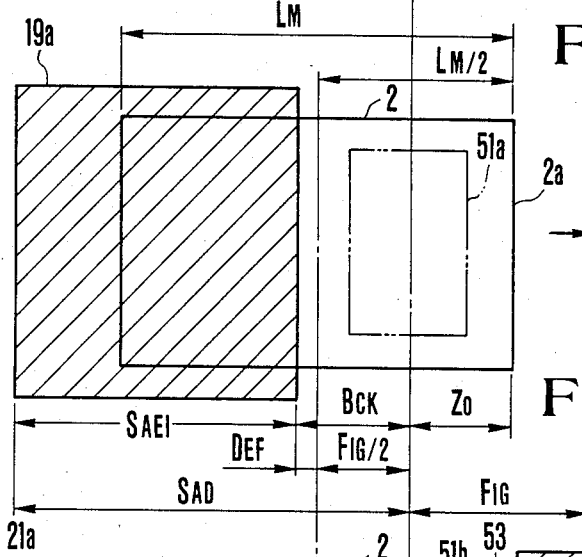
FIG.8B1
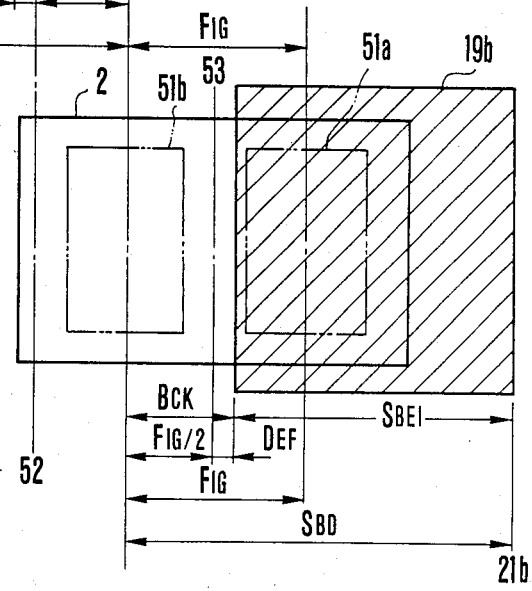
FIG.8B2

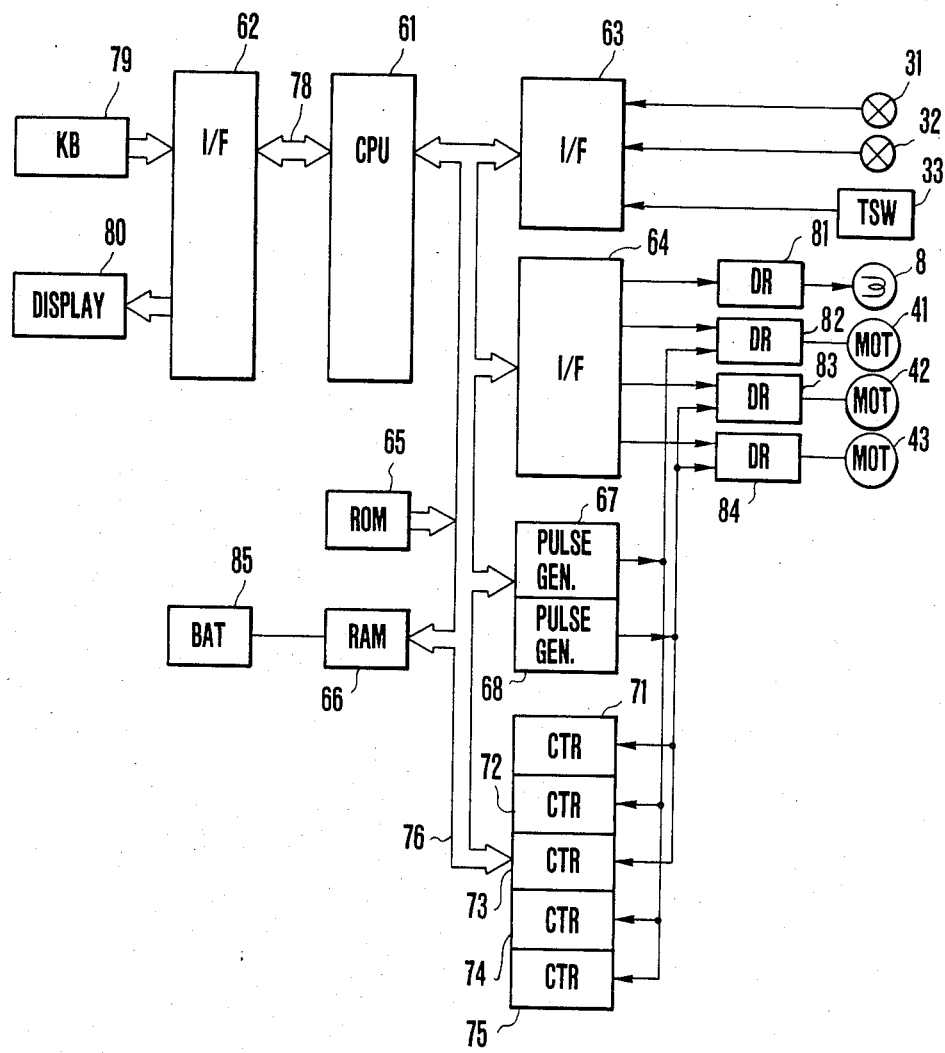
F I G. 10

EXPOSURE DEVICE FOR PLATEMAKING APPARATUS

BACKGROUND OF THE INVENTION

The present invention relates to a platemaking apparatus for making an offset printing plate and, more particularly, to an exposure control device for a platemaking apparatus for forming an identical document on a master paper (original plate) a plurality of times.

Conventionally, when the identical document is to be formed on the master paper a plurality of times, during the first exposure operation, black paper 001 is placed on a portion subjected to second exposure operation, as shown in FIG. 1A. During the second exposure operation, the black paper 001 is placed on the first exposed portion so as not to expose a latent image 002 with the second exposure light, as shown in FIG. 1B. Reference numeral 003 denotes a document table; 004, a document; 005 and 006, a lens and a mirror, respectively, which constitute an optical system; 007, a plate material; 008, an exposure region; 009, a nonexposure region; and 010, a latent image formed by the second exposure operation.

According to the conventional technique using the black paper, the document 004 must be moved between the first and second exposure operations. The exposure cycle is cumbersome, thereby degrading positional precision. In addition, when positioning with high precision is required, the entire operation is time-consuming. Even if the black paper 001 is placed on the document table 003, the black paper 001 cannot completely absorb the light. A potential at the nonexposure region (i.e., the exposed portion during the second exposure operation) decreases during the first exposure operation. Furthermore, when it takes a long time to replace the document 004, dark attenuation also causes a decrease in the potential. Therefore, typical differences between the first and second exposure operations occur, resulting in inconvenience.

SUMMARY OF THE INVENTION

It is a principal object of the present invention to eliminate the conventional drawbacks described above and to provie an exposure device for a platemaking apparatus wherein an image can be formed at a precise position, and exposure differences between the exposure cycles are small even if an identical image is formed a plurality of times, thereby obtaining a high-quality original plate.

It is another object of the present invention to provide an exposure device for a platemaking apparatus, wherein a plate can be easily formed at high speed without need for a document on a document table to be moved.

It is still another object of the present invention to provide an exposure device for a platemaking apparatus, wherein an identical image can be automatically formed a plurality of times on a plate material.

In order to achieve the above objects of the present invention, there is provided an exposure device for a platemaking apparatus, comprising plate material feed means for feeding or stopping feed of a plate material at an exposure portion; at least one shielding curtain for shielding part of the exposure portion; shielding curtain driving means for spreading the shielding curtain on the exposure portion; setting means for setting conditions required for forming a plurality of document images on the plate material; and control means for controlling movement of the plate material feed means and the shielding curtain driving means in a predetermined positional relationship in accordance with command data from the setting means.

BRIEF DESCRIPTION OF THE DRAWINGS

FIGS. 1A and 1B are respectively perspective views showing a conventional exposure operation when a document image is formed a plurality of times on a plate material; and FIGS. 2 to 16 show an embodiment of the present invention, in which FIG. 2 is a sectional view of a platemaking apparatus, FIG. 4 is a partially cutaway perspective view of the exposure unit shown in FIGS. 3A and 3B, FIG. 5 is a partially cutaway perspective view of a shielding curtain of the apparatus shown in FIG. 2, FIGS. 6A and 6B, 7A, 7B, 8A, 8B1, 8B2, 9A, 9B1 and 9B2 are respectively schematic views showing the relationship between the document and the plate material, FIG. 10 is a block diagram showing an electric circuit for the exposure unit shown in FIGS. 3A and 3B, and FIGS. 11 to 16 are respectively flow charts for explaining the operation of the exposure device shown in FIGS. 3A and 3B.

DESCRIPTION OF THE PREFERRED EMBODIMENT

The present invention will be described in detail with reference to a preferred embodiment in conjunction with the accompanying drawings.

Figure 2:
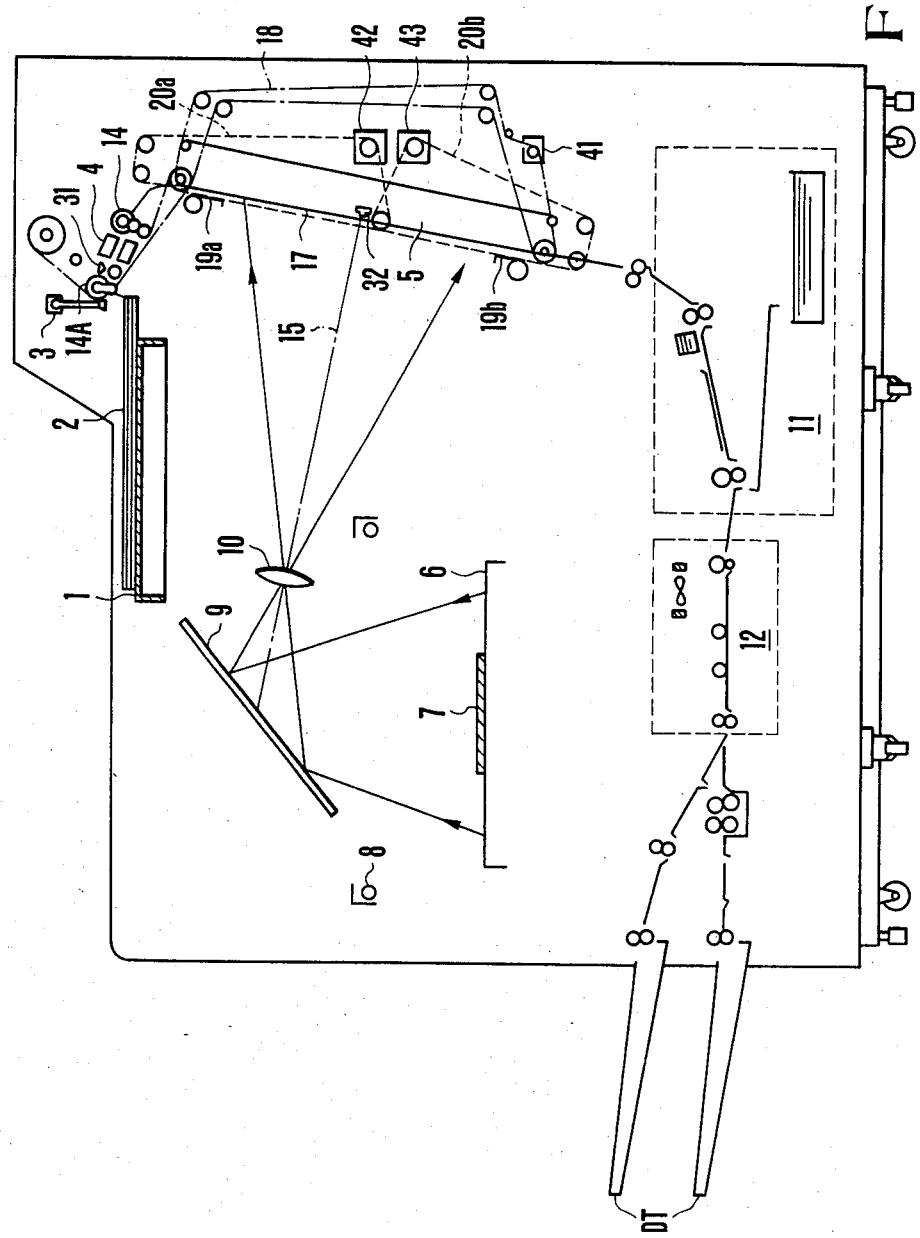

FIG. 2 is a side sectional view showing the overall configuration of a platemaking apparatus. Plate material sheets (i.e., master paper) 2 placed on a paper feed table 1 are fed one by one by a suction mechanism 3. The sheet 2 is charged with a high voltage by a charger 4 while the sheet is being fed by rollers 14. The sheet is then fed to an exposure unit 5 which is evacuated to a negative pressure.

A document placed on a document table 6 movable along the lateral direction is illuminated by a lamp 8 located above the peripheral portion of the document table 6. An image from the document is picked up by an image pickup lens 10 through a mirror and projected on the exposure unit 5, thereby exposing the plate material sheet 2.

The exposed plate material sheet 2 is fed to a developing unit 11 by rollers. The latent image on the plate material sheet 2 is developed, and the plate material sheet 2 passes though a fixing unit 12. The visible image of the plate material sheet 2 is fixed, and the sheet is dried. The resultant sheet is delivered as a press plate to a delivery table DT.

A photoelectric plate material length sensor (to be referred to as a length sensor hereinafter) 31 is arranged between the paper feed table 1 and the exposure unit 5. An overall length of the plate material sheet 2 is detected in accordance with detection of the plate material sheet 2 and the rotational speed of rollers 14 and 14A. A photoelectric stop sensor 32 is arranged at a position aligned with an optical axis 15 of the exposure unit 5. The stop sensor 32 detects a leading edge of the plate material sheet 2 and determines a distance for which the plate material sheet 2 is further fed.

A step motor (to be referred to as a motor hereinafter) 41 is arranged for driving rollers through conveyor belts 17 having a number of vent holes and chains 18. The belts 17 and chains 18 are mounted in the exposure unit 5. Motors 42 and 43 are arranged to drive upper and lower shielding curtains 19a and 19b through wires 20a and 20b, respectively. The rotational speeds of the upper and lower shielding curtains 19a and 19b are controlled in response to the number of drive pulses applied to the motors 42 and 43, respectively. The feeding state of the plate material sheet 2 and the spreading states of the curtains 19a and 19b are thus controlled.

Figure 3A:
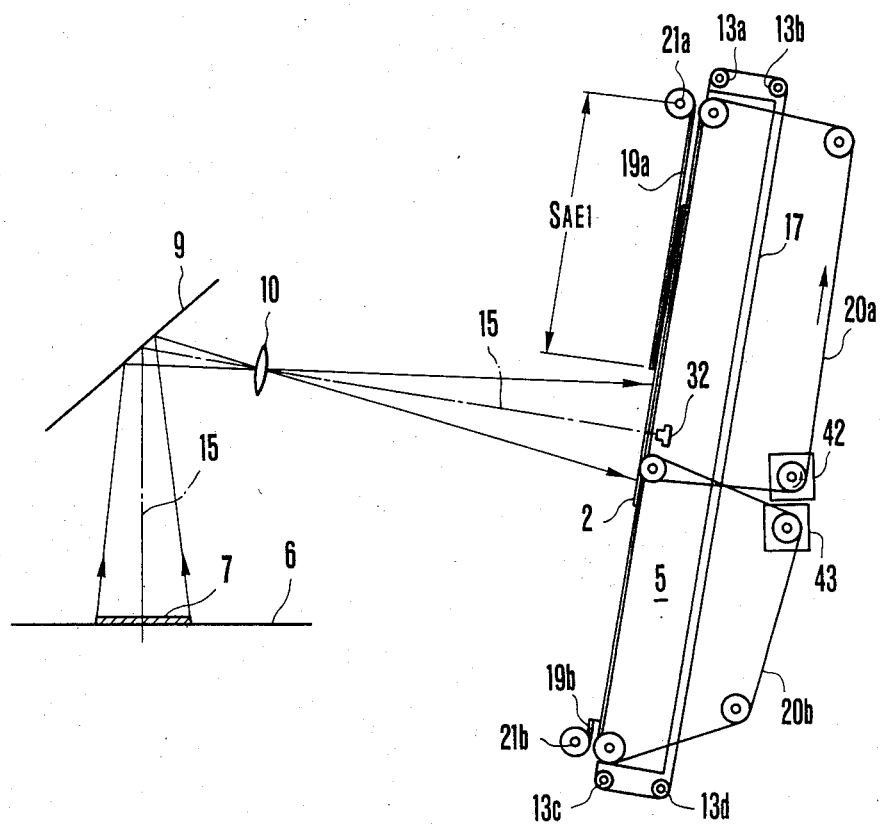
FIGS. 3A and 3B are respectively side views showing different operating states of an exposure unit of the apparatus of FIG. 2.
Figure 3B:
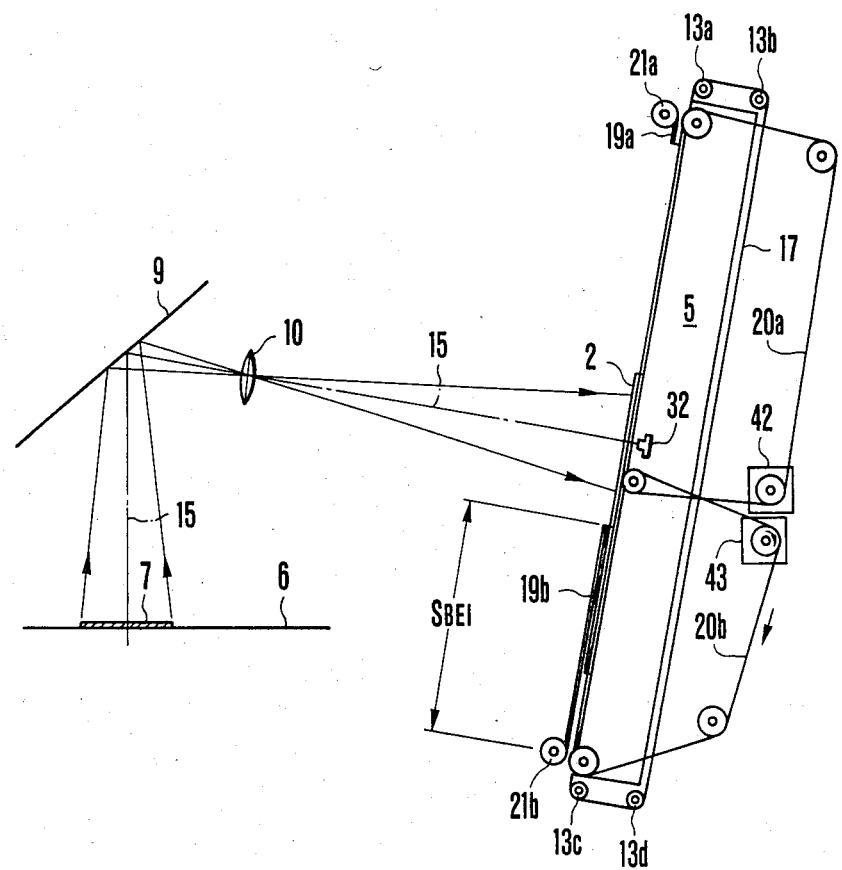

FIGS. 3A and 3B are views for explaining double exposure wherein an identical image is formed at different regions of the common plate material sheet. As shown in FIG. 3A, the document 7 is placed on the document table 6 such that the center of the document is aligned with the optical axis 15. At the same time, the center of the exposure region for the first exposure is aligned with the optical axis 15. The plate material sheet 2 is positioned to satisfy the above requirements. The shielding curtain 19a is extended by the motor 42 for a length SAE1 along the direction of arrow with respect to a take-up shaft 21a of the shielding curtain 19a located above the exposure unit 5, thereby masking the nonexposure region of the plate material sheet 2 with the shielding curtain 19a. Under this condition, the first exposure operation is performed to form a first document image in a leading region of the plate material sheet 2.

As shown in FIG. 3B, the plate material sheet 2 is moved by the motor 41 downward until the center of the exposure region for the second exposure operation is aligned with the optical axis 15 while the document 7 is left unmoved. At the same time, the shielding curtain 19b is extended by the motor 43 for a length SBE1 along the direction of arrow with respect to a take-up shaft 21b of the shielding curtain 19b located below the exposure unit 5. Under this condition, the second exposure operation is performed to form a second document image in a trailing region of the plate material sheet 2.

Figure 4:
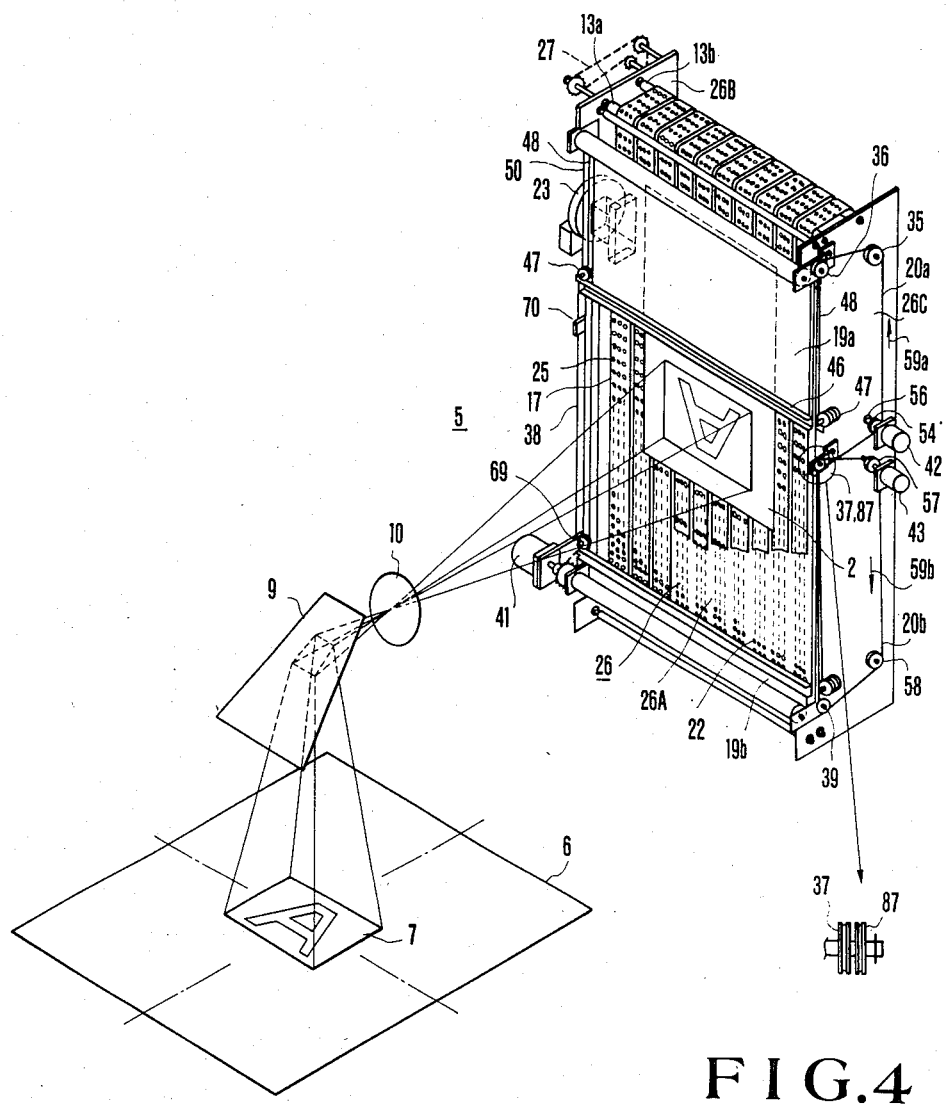

FIG. 4 is a partially cutaway perspective view showing the exposure unit 5. Referring to FIG. 4, the exposure unit 5 has a suction box 26 for drawing the plate material sheet 2. The suction box 26 comprises an upright box which is constituted by a suction plate 26A with a number of apertures, a pair of side plates 26B and 26C, and rear, upper and lower plates (not shown). A blower 23 is mounted on the side plate 26B. A pair of rollers 13a and 13b and a pair of rollers 13c and 13d (FIGS. 3A and 3B) are mounted on the upper and lower surfaces of the box 26, respectively. The plurality of endless conveyor belts 17 with a number of apertures 25 are looped around the rollers 13a to 13d to surround the suction box 26. The conveyor belts 17 are driven by the motor 41 (arranged at the lower portion of the side plate 26B) from the top to the bottom of the exposure surface of the suction box 26 through the chains 27 or the like. The conveyor belts 17 hold the master paper 2 fed from the paper feed table 1 through the charger 4 and feed or stop feeding the master paper 2 at a predetermined exposure position. In this case, the master paper 2 is drawn by the blower 23 through the apertures 25 of the conveyor belts 17 and the apertures 22 of the suction plate 26A, so that the master paper 2 is tightly held by the conveyor belts 17. The stop sensor 32 is arranged at the center of the suction plate 26A to detect the leading edge of the master paper 2.

The first and second (i.e., upper and lower) shielding curtains 19a and 19b are wound above and below the exposure surface of the suction box 26. As shown in FIG. 5, the first shielding curtain 19a is rotatably wound around a drum shaft 87 through bushings 88 and bosses 89. The drum shaft 87 is biased by a coil spring 44 such that the corresponding curtain is wound up. One end of the curtain 19a is fixed on the outer surface of a drum 45 and the other end thereof is fixed at a bar 46. The curtain 19a is normally wound around the outer surface of the drum 45 by the biasing force of the spring 44. During the first exposure operation, the curtain 19a is pulled downward. The drum shaft 87 is fixed and supported between the upper ends of the side plates 26B and 26C. The coil spring 44 is housed in the drum 45 and has two ends respectively fixed at the pair of bosses 89 (one of the bosses is fixed with respect to the drum shaft 87). When the shielding curtain 19a is pulled in the direction of arrow in FIG. 4, the drum 45 is rotated clockwise, so that the coil spring 44 is further wound to store energy. Guide rollers 47 are rotatably disposed at two ends of the bar 46. Wires 20a and 50 are also fixed at the two ends of the bar 46. The guide rollers 47 are rolled along longitudinal long rails 48 formed by bending edges of the exposure surfaces of the side plates 26B and 26C, respectively. The right wire 20a of the wires 20a and 50 is looped around pulleys 35, 36 and 37 which are arranged on the side plate 26C and a drive pulley 54 directly coupled to the first shielding curtain drive motor 42 comprising a pulse motor. Similarly, the left wire 50 is looped around three pulleys (not shown) arranged on the side plate 26B and another drive pulley (not shown) directly coupled to the motor 42. In this case, a drive shaft 56 of the motor 42 is supported by the left and right side plates 26B and 26C. The distal end of the drive shaft 56 extends outside through the side plate 26B and the above-mentioned other drive pulley is mounted on the extended end portion. Therefore, when the motor 42 is driven to move the wires 20a and 50 along the direction indicated by arrow 59a of FIG. 4, the bar 46 is moved downward, and the first shielding curtain 19a is pulled downward against the biasing force of the spring 44. When a DC voltage is applied to the motor 42, the curtain 19a is stopped upon braking of the motor 42. When braking is cancelled, the curtain 19a is wound up by the biasing force of the spring 44.

Since the second shielding curtain 19b has substantially the same arrangement as the first shielding curtain 19a, a detailed description thereof will be omitted. However, the second shielding curain 19b is arranged upside down with respect to the first shielding curtain 19a. When the wire 20b and a wire 38 are moved in the direction indicated by arrow 59b of FIG. 4 upon operation of the motor 43 comprising a pulse motor, the second shielding curtain 19b is moved upward. Reference numerals 58, 39 and 87 denote pulleys around which the wire 20b is looped; 57, a drive pulley directly coupled to the second shielding curtain drive motor 43; and 69 and 70, pulleys for the wire 38.

The exposure device of the above embodiment is operated such that the first shielding curtain is extended during the first exposure operation to cover the exposure region of the second exposure operation and the second shielding curtain is extended during the second exposure operation to cover the exposure region of the first exposure operation. Therefore, light components during the first and second exposure operations will not influence the second and first exposure operations, respectively, thereby forming a high-quality plate. In addition, since the document on the document table need not be moved, the resultant image has high positional precision. Even if the document is set once, its image can be formed a plurality of times at different regions of the plate material sheet or master paper.

Automatic exposure of the exposure device described above will be described when platemaking is performed in accordance with different platemaking requirements.

Figure 6A:
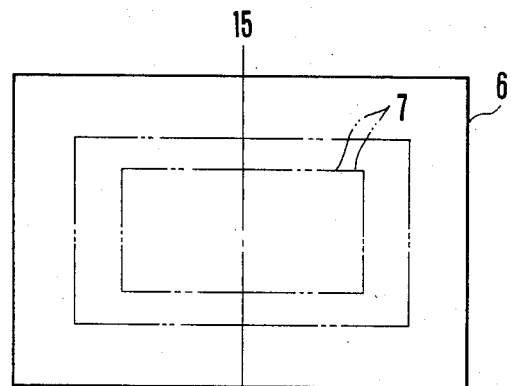
Figure 6B:
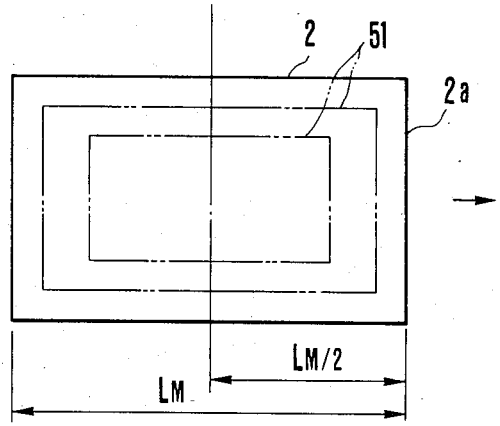

FIGS. 6A and 6B show a relationshp between the document 7 and the plate material sheet 2 when exposure is performed under the condition wherein the optical axis 15 is aligned with the center of the plate material sheet 2. Referring to FIG. 6A, the optical axis 15 is aligned with the center of the document. At the same time, as shown in FIG. 6B, an overall length LM of the plate material sheet 2 is measured. When the leading edge 2a of the plate material sheet 2 being fed along the direction of arrow is aligned with the optical axis 15 of the exposure unit 5, the plate material sheet 2 is further fed by a distance LM/2 and is stopped. When the plate material sheet 2 is thus subjected to exposure, a document image 51 can be accurately formed at the central portion of the plate material sheet 2 in accordance with the actual overall length LM thereof.

If a feed length of the plate material sheet 2 driven by the roller 14 in response to one pulse applied to the motor 41 is defined as LSR and the number of pulses applied to the motor 41 during which the length sensor 31 generates an output is defined as N, the overall length LM of the plate material sheet 2 is given as follows:

$$LM = N \times LSR \quad (1)$$

If a feed length of the plate material sheet 2 driven by the belts 17 in response to one pulse applied to the motor 41 is defined as LPS, and an offset value for correcting an error caused by mounting conditions and sensitivity variations of the stop sensor 32 is defined as OFS, a feed distance Z1 after the coincidence between the leading edge 2a of the plate material sheet 2 and the optical axis 15, and the number of pulses M1 to be applied to the motor 41 for feeding the plate material sheet 2 by the feed distance Z1 are given as follows:

$$Z1 = LM/2 + OFS \quad (2)$$

$$M1 = Z1/LPS \quad (3)$$

As is apparent from the above equations, after the leading edge 2a of the plate material sheet 2 is detected by the stop sensor 32, the pulses given by equation (3) are applied to the motor 41 and the motor 41 is then stopped.

Figure 7A:
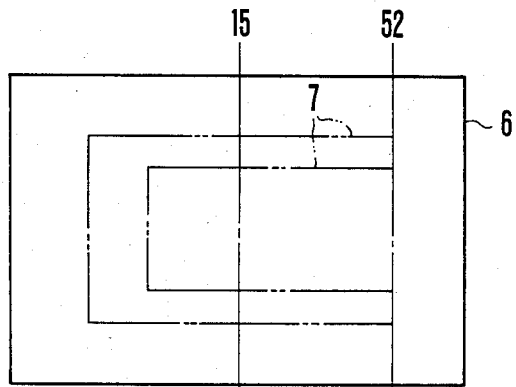
Figure 7B:
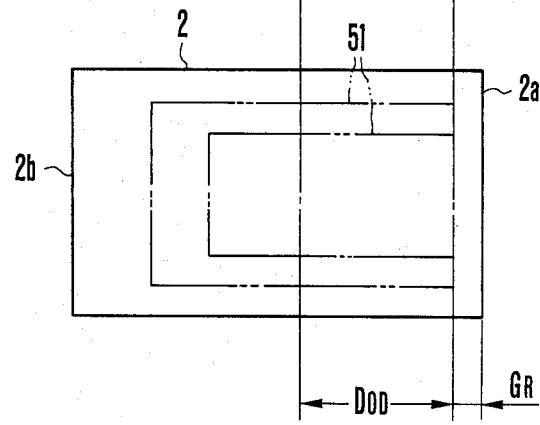

FIGS. 7A and 7B show side exposures wherein a blank portion called a gripper is formed from the leading edge 2a of the plate material sheet 2 and a document image 51 is formed through a gripper width GR. As shown in FIG. 7A, one end of the document 7 is aligned with a reference position 52 on the document table 6. At the same time, as shown in FIG. 7B, after the leading edge 2a of the plate material sheet 2 fed along the direction of arrow is aligned with the optical axis 15, the plate material sheet 2 is further fed by a distance corresponding to the gripper width GR and the distance DOD between the optical axis 15 and the reference position 52. In this state, the plate material sheet 2 is stopped and is subjected to exposure, thereby forming the document image 51 at the desired region.

In this case, after the stop sensor 32 detects the leading end 2a of the plate material sheet 2, the number M1 of pulses applied to the motor 41 is calculated as follows:

$$M1 = (DOD + GR + OFS)/LPS \quad (4)$$

FIGS. 8A to 8B2 show the same double exposure as in FIGS. 6A and 6B, wherein center 53 of the plate material sheet 2 is used as a reference position and an identical image is repeatedly formed at regions symmetrical about the reference position. As shown in FIG. 8A, the center of the document 7 is aligned with the optical axis 15. At the same time, as shown in FIG. 8B1, after the shielding curtain 19a is extended by a length SAE1 with respect to the shaft 21a housing the shielding curtain 19a, the plate material sheet 2 is fed until the position of the plate material sheet 2 which corresponds to the center of a first document image 51a is aligned with the optical axis 15. The plate material sheet 2 is then stopped and subjected to the first exposure operation, thereby forming the first document image 51a.

As shown in FIG. 8B2, if a distance between the first document image 51a and a second document image 51b, an overlapping light-shielding prevention width for preventing formation of a color stripe on the developed plate material sheet 2, an extension distance of the shielding curtain 19a in response to one pulse applied to the motor 42, and a distance between the shaft 21a and the optical axis 15 are defined as FIG, DEF, LPA and SAD, respectively, a distance BCK between the leading edge of the shielding curtain 19a and the optical axis 15 and the number of pulses SA applied to the motor 42 are given as follows:

$$BCK = FIG/2 + DEF \quad (5)$$

$$SA = (SAD - BCK)/LPA \quad (6)$$

A distance Z0 between the leading edge 2a upon stopping of the plate material sheet 2 and the optical axis 15, and the number M1 of pulses applied to the motor 41 upon detection of the leading edge 2a by the stop sensor 32 are given as follows:

$$\begin{aligned} Z0 &= LM/2 - FIG/2 + OFS \\ &= (LM - FIG)/2 + OFS \end{aligned} \quad (7)$$

$$M1 = Z0/LPS \quad (8)$$

As shown in FIG. 8B2, the shielding curtain 19a returns to the initial position, and at the same time the shielding curtain 19b is extended by the length SBE1 with respect to the shaft 21b housing the shielding curtain 19b. The plate material sheet 2 is further fed by a distance corresponding to FIG and is then subjected to the scond exposure operation. As a result, the second document image 51b is formed.

The distance BCK is given by equation (5), and the number SB of pulses to be applied to the motor 43 is given as follows:

$$SB = (SBD - BCK)/LPB \quad (9)$$

where SBD is the distance between the shaft 21b and the optical axis 15, and LPB is the extension length of the shielding curtain 19b in response to one pulse applied to the motor 43.

In addition, the number M2 of pulses to be supplied to the motor 41 so as to feed the plate material sheet 2 by the distance FIG is given as follows:

$$M2 = FIG/LPS \tag{10}$$

Figure 9A:
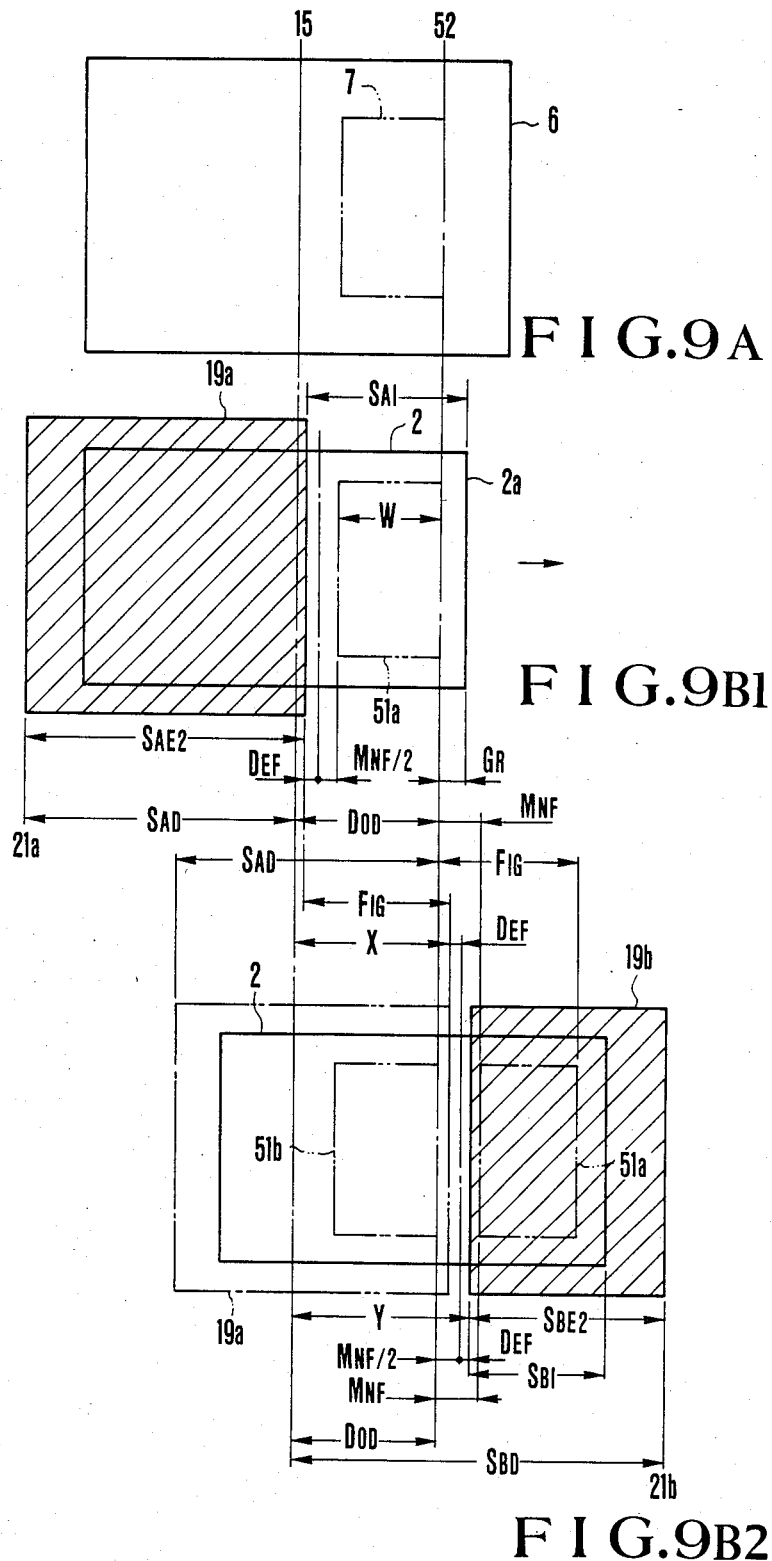

FIGS. 9A to 9B2 show the same double exposure as in FIG. 6 under the same conditions as in FIG. 7. As shown in FIG. 9A, one end of the document 7 is aligned with the reference position 52 of the document table. At the same time, as shown in FIG. 9B1, the shielding curtain 19a is extended by a length SAE2 with respect to the shaft 21a, and the leading edge 2a of the plate material sheet 2 is aligned with the optical axis 15. Thereafter, the plate material sheet 2 is further fed by a distance corresponding to a sum of a gripper width GR and a distance DOD between the optical axis 15 and the reference position 52. The plate material sheet 2 is stopped and then subjected to the first exposure operation, thereby forming a first document image 51a.

Since a width W of the first document image 51a is indefinite, the shielding curtain 19a is represented by an imaginary line of FIG. 9B2 so as to obtain the extension length SAE2. In this case, if the blank width between the first document image 51a and a second document image 51b is defined as MNF, a distance X between the leading edge of the shielding curtain 19a and the optical axis 15 is given as follows:

$$X = DOD + MNF/2 - DEF \tag{11}$$

Referring to FIGS. 9B1 and 9B2, relative displacement FIG corresponding to the length FIG has occurred and leading edge distances (FIGS. 9B1 and 9B2) of the shielding curtains are given as FIG, the number SA of pulses (applied to the motor 42) which corresponds to the extension length SAE2 is given as follows:

$$SA = (SAD + X - FIG)/LPA \tag{12}$$

In the same manner as in FIGS. 8A and 8B, the shielding curtain 19a returns to the initial position. At the same time, the shielding curtain 19b is extended by the length SBE2. Thereafter, the plate material sheet 2 is fed by a distance FIG and is then exposed to form the second document image 51b.

A distance Y between the optical axis 15 and the leading edge of the shielding curtain 19b and the number SB of pulses applied to the motor 43 in accordance with the extension length SBE2 are given as follows:

$$Y = DOD + MNF/2 + DEF \tag{13}$$

$$SB = (SBD - Y)/LPB \tag{14}$$

The number M2 of pulses applied to the motor 41 so as to feed the plate material sheet 2 is given by equation (10).

Errors in LPS, SAD and SBD in equations (3) to (14) occur due to the dimensional and mounting errors of the belts 17, rollers looped with the belts 17 and the shafts 21a and 21b. At the same time, the position of the stop sensor 32 is not always aligned completely with the optical axis 15. When the motors 41, 42 and 43 control the movable members such as the plate material sheet 2 and the shielding curtains 19a and 19b, the errors must be corrected.

In order to correct these errors, test operation must first be performed. Platemaking is performed under specific conditions to obtain actual values corresponding to design values, thereby correcting the calculations given by equations (2) to (4). Even if special mechanism corrections are not performed, the control errors can be fine-adjusted.

Since the value LPS is the basis of the operation, it is convenient to correct the value LPS. Assume that the value FIG is to be corrected for double exposure. The first and second document images 51a and 51b are formed on the plate material sheet 2 and developed. The distance between the images 51a and 51b is actually measured to obtain an actual value STI, thereby obtaining a corrected value LPS as follows:

$$LPS = STI/M2 \tag{21}$$

where M2 is the number of pulses applied to the motor 41 so as to feed the plate material sheet by the distance FIG.

Subsequently, correction is required in association with the position of the stop sensor 32. The side double exposure state in FIGS. 9A to 9B1 is obtained, and the first and second document images 51a and 51b are formed for GR=0 in the same manner as described above. The distance between the reference position of the image corresponding to the first document image 51a and the leading edge 2a is actually measured to obtain an actual value SCI, thereby calculating the offset value OFS as follows:

$$OFS = SCI - DOB \tag{22}$$

where DOB is the design reference distance value between the optical axis 15 and the stop sensor 32 in accordance with the design specifications.

In order to correct the value SAD of the shielding curtain 19a, the state in FIGS. 8A and 8B is obtained. In this case, assume that the values GR and FIG are to be corrected. The first exposure operation is performed to expose only the portion of the plate material sheet which corresponds to the first document image 51a. The exposed width SAI from the leading edge 2a is actually measured, and a corrected distance SAD is obtained using a design reference value SAS:

$$SAD = SADS + (SAI - SAS) \tag{23}$$

where SADS is the value SAD before correction.

In order to correct the value SBD of the shielding curtain 19b, the state and conditions which are required for the correction mode are set, and the second exposure operation is performed to expose a region of the plate material sheet which corresponds to the second document image 51b. A nonexposed width SBI from the leading edge 2a is actually measured, and a corrected SBD is calculated using a reference value SBS and the value SBDS as the SBD before correction:

$$SBD = SBDS + (SBS - SBI) \tag{24}$$

When the above correction operations are completed, the exposure device is controlled in accordance with the calculations by equations (3) to (14), so that the positions of the respective movable members can be accurately controlled.

FIG. 10 is a block diagram of an electric arrangement of the exposure device. A processor (to be referred to as a CPU hereinafter) 61 such as a microprocessor as a central unit is connected to interfaces (to be referred to as I/Fs hereinafter) 62 to 64, a ROM (read-only memory) 65, a RAM (random access memory) 66, pulse generators 67 and 68 comprising frequency dividers, and presettable counters (to be referred to as counters hereinafter) 71 to 75 through buses 76 and 78. The I/F 62 is connected to a keyboard 79 and a display 80 such as a character display.

The I/F 63 is connected to the length sensor 31, the stop sensor 32 and a switch 33 used for fine adjustment. The switch 33 sets the exposure device in the correction mode. When correction is completed, the correction mode is automatically cancelled. Unless the correction mode is set by the switch 33, the input values cannot be updated. The I/F 64 is connected to drivers 81 to 84 which respectively drive the illumination lamp 8 turned on during exposure and the motors 41, 42 and 43.

The pulse generators 67 and 68 divide the frequency of a clock pulse under the control of the CPU 61 and supply drive pulses having predetermined periods to the motors 41, 42 and 43 through the drivers 82, 83 and 84. At the same time, the drive pulses are supplied to the counters 71, 72, 73 and 74 which start counting the drive pulses.

The CPU 61 as the control unit executes instructions stored in the ROM 65 and also performs arithmetic and logic operations while necessary data in the RAM 66 is accessed in response to the respective input data through the I/Fs 62 and 63. The CPU 61 sends out control signals through the I/F 64 to control the drivers 81, 82, 83 and 84. The CPU 61 also fetches key input signals from the keyboard 79 through the I/F 62 and supplies display data to the display 80.

The CPU 61 presets counts in the counters 71 to 74 in response to the input data from the keyboard 79 and monitors the count-down operation thereof and a count-up operation of a counter 75. The CPU 61 also controls the start, stop and clear operations of the counters 71 to 75. A backup battery 85 is connected to the RAM 66 to hold the contents of the RAM 66 while power is cut off therefrom.

Figure 11:
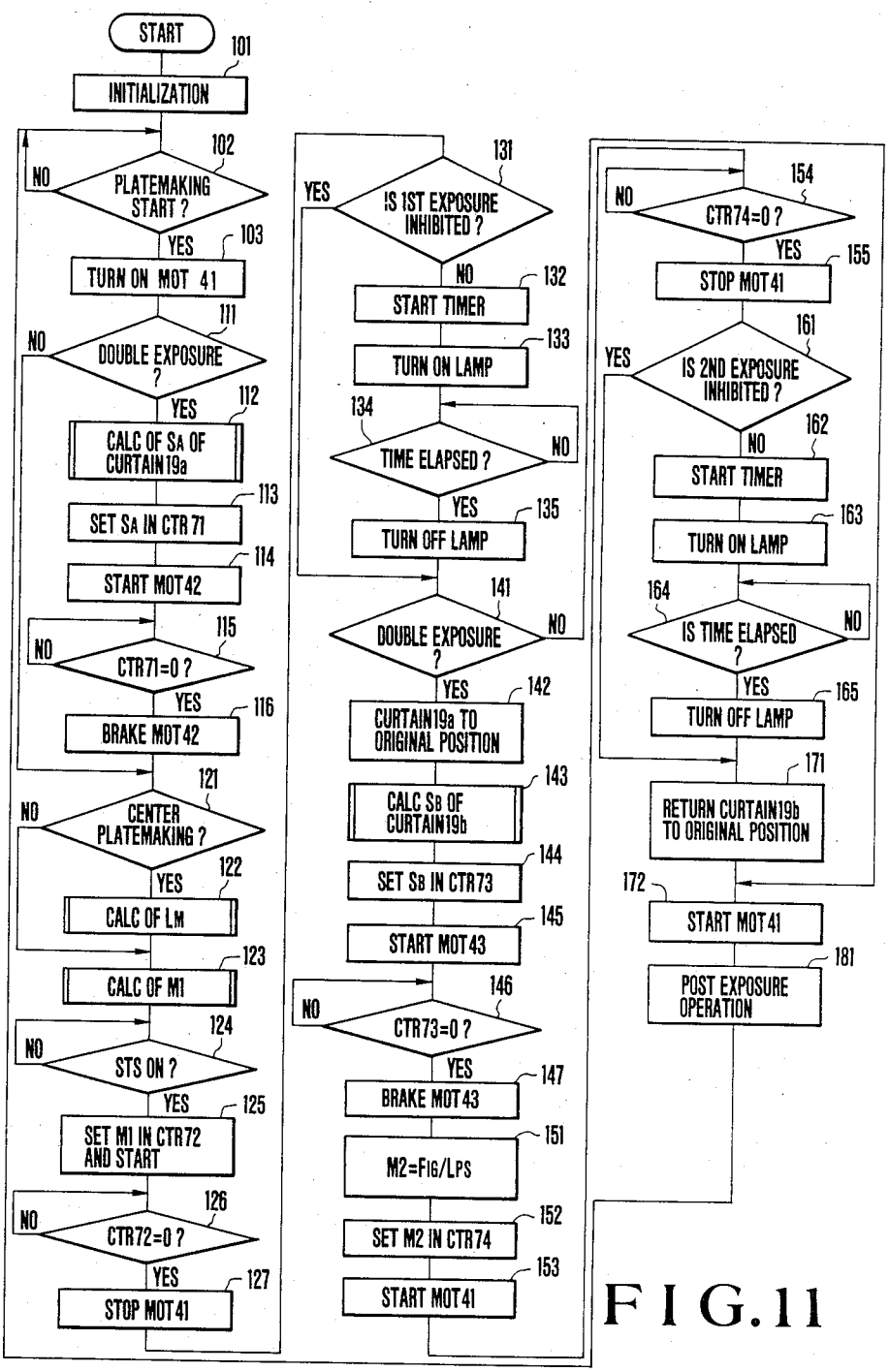

FIG. 11 is a flow chart for explaining the control operation of the CPU 61. In step 101, the CPU 61 clears the counters 71 to 75. When data (e.g., SADS and SBDS) prior to correction are required, the design values are stored in the ROM 65, and the data prior to correction must be transferred to he RAM 66 during initialization. It should be noted that the above operation is performed only when the RAM 66 is accessed for the first time since the RAM 66 is backed up. In step 102, the CPU 61 waits a platemaking start command from the keyboard 79. When the CPU 61 receives this command, the flow advances to step 103. In step 103, the CPU 61 causes the driver 82 to supply a pulse to the motor 41 which is then started. In step 111, if the CPU 61 determines that double exposure is required, the flow advances to step 112. However, if NO in step 111, the flow jumps to step 121. In step 112, the CPU 61 calculates the value SA of the shielding curtain 19a. In step 113, the value SA is set in the counter 71, and the flow advances to step 114. In step 114, the CPU 61 causes the diver 83 to supply a pulse to the motor 42 which is then started. In step 115, the counter 71 is decremented in response to the pulse supplied to the motor 42. When the CPU 61 determines that the count of the counter 71 is zero, the CPU 61 causes the driver 83 to DC energize the motor 42 in step 116, thereby braking and stopping the motor 42. In this manner, the extension operation of the shielding curtain 19a is completed.

In step 121, the CPU 61 checks an input from the keyboard 79. When the CPU 61 determines that this input represents center platemaking, the CPU 61 calculates the overall length LM of the plate material sheet 2 in step 122. If NO in step 121, the flow advances to step 123 in which the value M1 is calculated. When the CPU 61 determines in step 124 that the stop sensor 32 detects the leading end 2a of the plate material sheet 2, the CPU 61 sets the value M1 in the counter 72 in step 125. In step 126, the CPU 61 monitors the count of the counter 72 and determines that the count is zero. Under this condition, in step 127, the CPU 61 causes the driver 82 to stop supplying the pulse to the motor 41 which is thus stopped. As a result, the plate material sheet 2 is stopped at a predetermined position.

The CPU 61 checks in step 131 whether or not a first exposure inhibit command is generated by the switch 33 and the keyboard 79. If YES in step 131, the flow jumps to step 141. However, if NO in step 131, the flow advances to step 132. The CPU 61 causes an internal exposure timer to start in step 132. In step 133, the CPU 61 controls the driver 81 to turn on the illumination lamp 8. In step 134, the exposure operation is performed. When a predetermined exposure time has elapsed, the CPU 61 controls the driver 81 to turn off the illumination lamp 8 in step 135.

The CPU 61 checks again in step 141 whether or not the double exposure command is entered. If NO in step 141, the flow jumps to step 172. However, if YES in step 141, the CPU 61 controls the driver 83 to DC energize the motor 42 which is then stopped in step 142, thereby causing the shielding curtain 19a to return to the original position. In step 143, the CPU 61 calculates the value SB for the shielding curtain 19b. The value SB is set in the counter 73 in step 144. Thereafter, in step 145, the CPU 61 controls the driver 84 to supply a pulse to the motor 43 which is then turned on. In step 146, the count of the counter 73 is decremented. When the CPU 61 determines that the count of the counter 73 is zero, the CPU 61 stops the motor 43 in step 147. As a result, the shielding curtain 19b is extended.

The flow advances to step 151, and the CPU 61 calculates the value M2 by equation (10) using the respective data FIG and LPS which are entered at the keyboard 79 and which are stored in the RAM 66. In step 152, the value M2 is set in the counter 74. In step 153, the motor 41 is started again. After the CPU 61 monitors in step 154 that the count of the counter 74 is zero, the motor 41 is stopped in step 155. The plate material sheet 2 is thus stopped at the second exposure position.

The same exposure operation as in steps 131 to 135 is performed in steps 161 to 165. Subsequently, the flow advances to step 172 wherein the driver 84 is controlled to return the shielding curtain 19b to the initial position.

In step 172, the CPU 61 controls the driver 82 to turn on the motor 41. After the CPU 61 performs the post exposure operations such as development and fixing operations, the flow returns to step 102, and the above steps are repeated.

FIGS. 12, 13, 14 and 15 are flow charts for explaining the detailed operations of steps 112, 122, 123 and 143 of FIG. 11, respectively.

Figure 12:
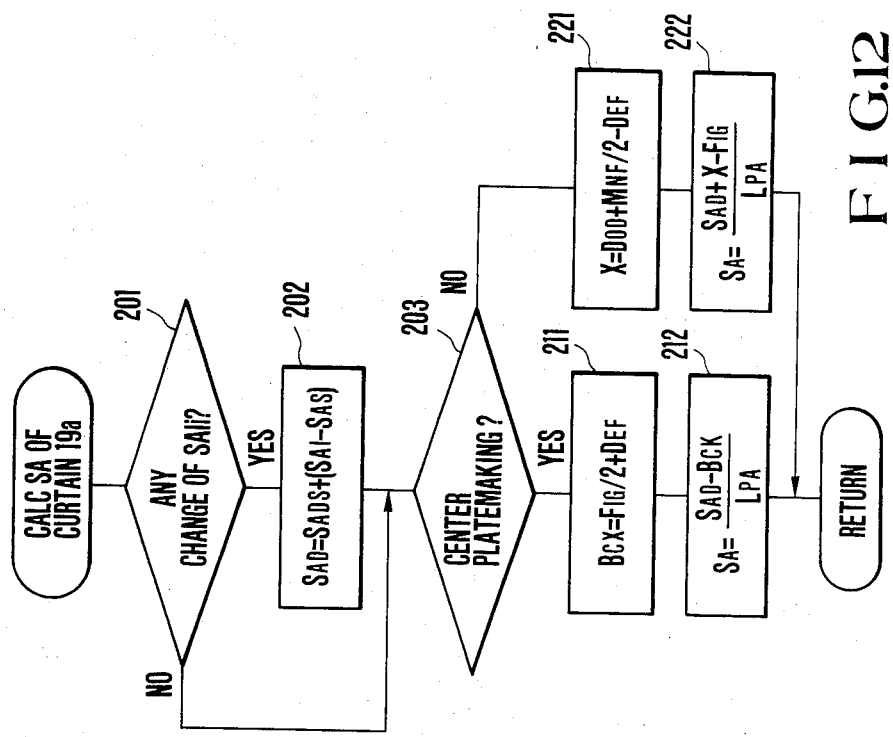

FIG. 12 shows the calculation of the value SA for the shielding curtain 19a. In step 201, the CPU 61 compares the old data of the actually measured value SAI with the new data thereof stored in the RAM 66 so as to check for any change. If YES in step 201, the flow advances to step 202. In step 202, the CPU 61 calculates the value SAD by equation (23) using the new actually measured value SAI. The CPU 61 checks in step 203 whether or not platemaking is center platemaking. If YES in step 203, the flow advances to steps 211 and 212 to calculate the value SA by equations (5) and (6). However, if NO in step 203, the flow advances to step 221 and 222 wherein the value SA is calculated by equations (11) and (12). The calculated value SA is stored in the RAM 66.

It should be noted that the values SADS and LPA are prestored in the RAM 66, the values SAS, DEF, DOD and MNF are prestored in the ROM 65 and the values SAI and FIG are entered at the keyboard 79 and stored in the RAM 66.

Figure 13:
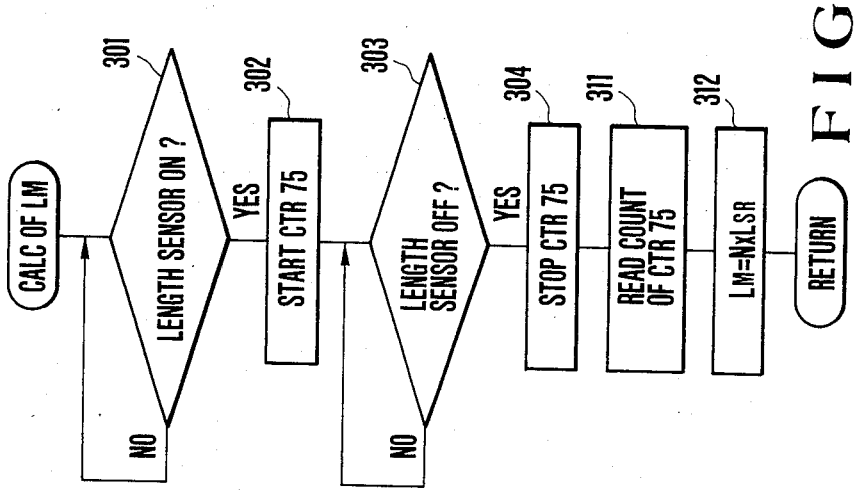

FIG. 13 is a flow chart for explaining the calculation of the overall length LM of the plate material sheet. In step 301, the length sensor 31 detects the leading edge 2a of the plate material sheet and is turned on. In response to the ON operation of the length sensor 31, the CPU 61 causes the counter 75 to start in step 302. When the CPU 61 detects in step 303 that the plate material sheet 2 passes by the length sensor 31, the sensor 31 is turned off. In step 304, the CPU 61 stops the operation of the counter 75. In step 311, the CPU 61 reads in the count of the counter 75. In step 312, the CPU 61 performs the calculation by equation (1) to obtain the value LM. The resultant value LM is stored in the RAM 66.

Figure 14:
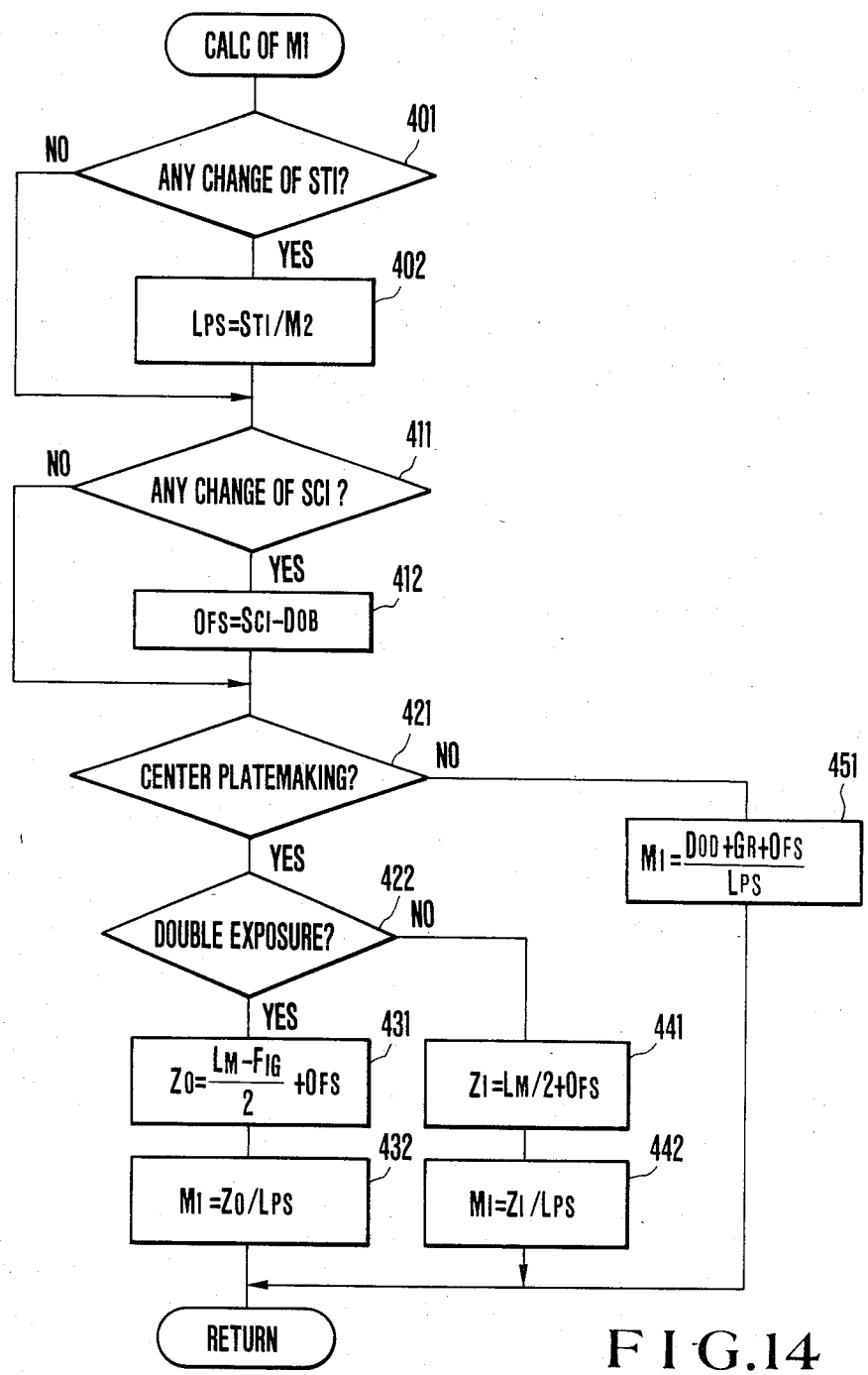

FIG. 14 is a flow chart for explaining the calculation of the value M1. In step 401, the CPU 61 checks a change in the actually measured value STI stored in the RAM 66 and obtained by a correction operation (to be descibed later). If YES in step 401, the CPU 61 calculates the value LPS by equation (21) using the new STI value. In step 411, the CPU 61 checks a change in the actually measured value SCI. If YES in step 411, the value OFS is calculated by equation (22) using the new SCI value in step 412. In step 421, the CPU checks whether or not platemaking is center platemaking. If YES in step 421, the flow advances to step 422. However, if NO, the flow jumps to step 451. The CPU 61 further checks in step 422 whether or not exposure is double exposure. If YES in step 422, the flow advances to step 431 and 432 wherein the value M1 is calculated by equations (7) and (8). However, if NO in step 422, the CPU 61 calculates the value M1 by equations (2) and (3). On the other hand, in step 451, the value M1 is calculated by equation (4). The respective values M1 are stored in the RAM 66.

It should be noted that the values M2, LM and LPS are prestored in the RAM 66, the values DOB and DOD are prestored in the ROM 65, and the values STI, SCI, SIG and GR are entered at the keyboard 79 and stored in the RAM 66.

Figure 15:
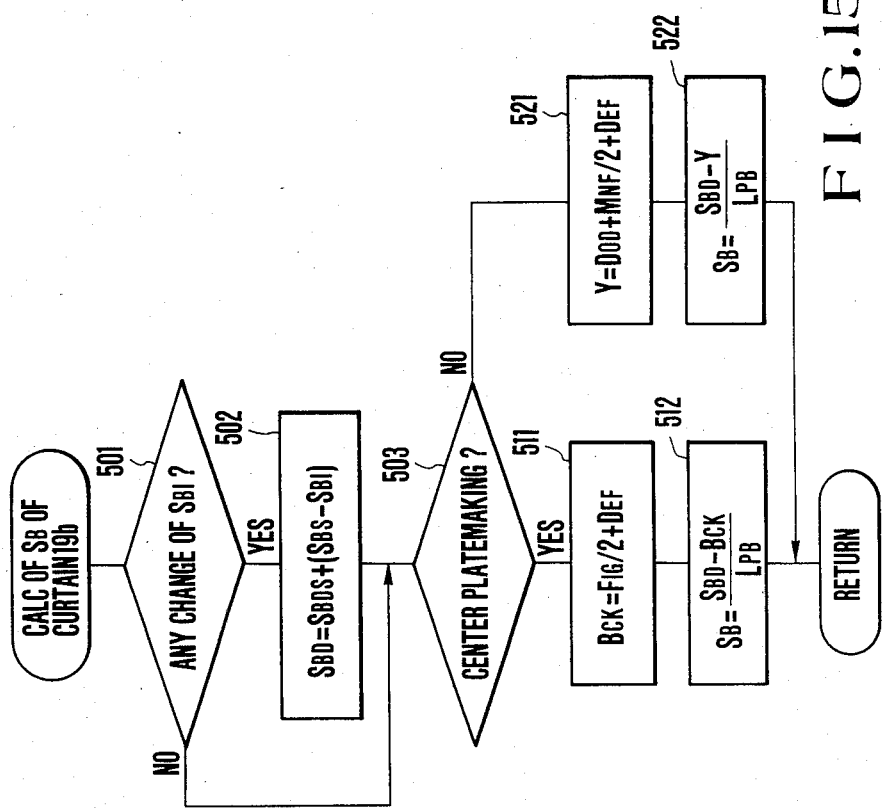

FIG. 15 is a flow chart for explaining the calculation of the value SB of the shielding curtain 19b. In step 501, the CPU 61 compares the old actually measured value SBI with the new actually measured value SBI so as to check whether or not a change in the value has occurred. If YES in step 501, the value SBD is calculated by equation (24) using the new SBI value in step 502. The CPU 61 checks in step 503 whether or not platemaking is center platemaking. If YES in step 503, the value SB is calculated by equations (5) and (9) in steps 511 and 512. However, if NO in step 503, the value SB is calculated by equations (13) and (14) in steps 521 and 522. The resultant values SB are stored in the RAM 66.

Figure 16:
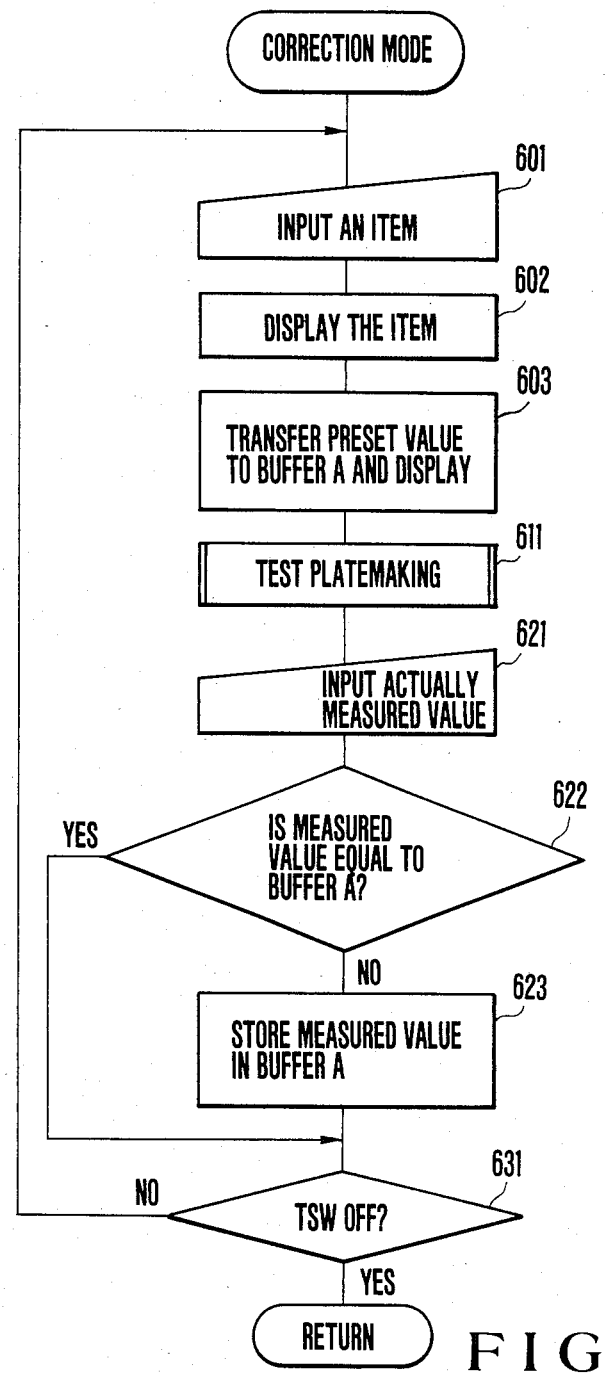

Finally, FIG. 16 is a flow chart for explaining correction of the actually measured value. When the switch 33 is turned on, the correction mode is set. The preset values stored in the ROM 65 are transferred to a buffer A of the RAM 66. In step 601, when an item is selected by a selection key in the keyboard 79, the input item is displayed as a code on the display 80. In step 603, the preset value corresponding to this item is read out from the buffer A of the RAM 66 and is displayed on the display 80. In step 611, test platemaking is performed in accordance with the procedures described with reference to FIGS. 9A to 9B2, thereby measuring an actually measured value corresponding to the preset value. When the operator enters the actually measured value with numeric keys on the keyboard 79 in step 621, the input data is compared with the corresponding data stored in the buffer A in step 622. If the CPU 61 determines that the input data is the same as the stored data, no correction operation is performed, and the flow jumps to step 631. However, if NO in step 622, the flow advances to step 623. In this case, the actually measured value is stored in the buffer A of the RAM 66 and displayed on the display 80. When the CPU 61 determines in step 631 that the switch 33 is not turned off, the flow returns to step 601 and the above operations are repeated.

When the preset value coincides with the actually measured value, step 621 can be omitted.

The positional adjustment of the stop sensor 32 is performed by calculating a positive or negative variation with respect to a central value derived from the actually measured value. For this reason, "+" and "−" keys are omitted from the keyboard 79. In addition, since the preset values are displayed on the display 80, these can be used as reference values.

Mechanical errors can be easily corrected, and a special correction switch or the like need not be used, thereby simplifying the overall configuration and improving positional precision.

Exposure portion control for the plate material sheet 2 can be accurate. Even if a dimensional error occurs in the plate material sheets 2, the document image can be formed on the desired region, and double exposure can be accurately and easily performed. Scattered light components will not be entered due to the presence of the shielding curtains 19a and 19b, so that a good plate with good contrast can be obtained at high speed.

However, if an error occurs in the size of the roller 14, an error in the overall length LM of the plate material sheet 2 occurs. For this reason, the roller 14 is tooled with high precision to prevent the error. The dimensional error of the roller 14 can be corrected in the same manner as described above.

In the above embodiment, the length sensor 31 and the stop sensor 32 comprise photoelectric sensors, respectively, but may be of another type. The shielding curtains 19a and 19b may be replaced with a single curtain. In this case, the single curtain may be moved along the peripheral portion of the exposure unit 5 and may be stopped at a predetermined position so as to perform masking, thereby obtaining the same effect as in the above embodiment. Furthermore, a combination of different logic circuits may be used in place of the CPU 61. The pulse generators 67 and 68 and the counter 71 to 75 may be replaced with software.

Referring to FIGS. 11 to 16, various modifications may be made. For example, the step order may be rearranged, and unnecessary steps may be omitted.

What is claimed is:

1. An exposure device for a platemaking apparatus, comprising:

plate material feed means for feeding and stopping a plate material on an exposure unit, said plate material feed means including a suction box which constitutes a main body of said exposure unit, has a number of apertures on a surface thereof and is evacuated; evacuating means; a conveyor belt, which surrounds the surface of said suction box to be slightly apart from the surface of said suction box for moving and stopping said plate material at a predetermined exposure position; and a conveyor belt drive mechanism having a motor for driving said conveyor belt, a roller and coupling means connected between said motor and said roller;

at least one shielding curtain for movably shielding part of a surface of said exposure unit;

shielding curtain drive means for driving said shielding curtain;

setting means for setting formation conditions of a document image to be formed on said plate material; and a control unit for controlling operations of said plate material feed means and said shielding curtain drive means in a predetermined relationship in response to the conditions from said setting means.

2. A device according to claim 1, wherein said at least one shielding curtain comprises first and second shielding curtains respectively rolled and disposed at two ends of said suction box; said shielding curtain drive means comprises first and second shielding curtain drive means for selectively extending said first and second curtains on said exposure unit; and said control means comprises a control unit which controls such that when a double exposure command is entered from said setting means, said first shielding curtain drive means pulls said first shielding curtain to shield a second exposure surface portion of said plate material during a first exposure operation, and said plate material is moved and stopped by said plate material feed means and said second shielding curtain drive means pulls said second shielding curtain to shield a first exposure surface portion of said plate material during a second exposure operation so as to shield a latent image formed by the first exposure operation.

3. A device according to claim 2, wherein said control unit includes a microprocessor, a random access memory, a read-only memory, a counter, a timer, and a driver, and said setting means comprises a keyboard, a switch and a display which are connected to input and output terminals of said microprocessor.

* * * * *